United States Patent
Chakraborty et al.

(10) Patent No.: US 9,941,916 B2
(45) Date of Patent: Apr. 10, 2018

(54) MULTI-BAND PROGRAMMABLE RECEIVER

(71) Applicant: Texas Instruments Incorporated, Dallas, TX (US)

(72) Inventors: Sudipto Chakraborty, Plano, TX (US); Vinod Mukundagiri, Dallas, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/609,943

(22) Filed: May 31, 2017

(65) Prior Publication Data

US 2017/0353205 A1    Dec. 7, 2017

Related U.S. Application Data

(60) Provisional application No. 62/345,300, filed on Jun. 3, 2016.

(51) Int. Cl.

| | |
|---|---|
| *H04L 27/00* | (2006.01) |
| *H04B 1/16* | (2006.01) |
| *H01L 27/02* | (2006.01) |
| *H03G 3/20* | (2006.01) |
| *H04B 5/00* | (2006.01) |

(52) U.S. Cl.
CPC .......... *H04B 1/16* (2013.01); *H01L 27/0255* (2013.01); *H03G 3/20* (2013.01); *H04B 5/0075* (2013.01)

(58) Field of Classification Search
CPC . H04L 27/2647; H04L 25/0319; H04L 27/01; H04B 1/30; H03H 7/40
USPC ......... 375/316, 229, 350; 455/566; 333/176, 333/188
See application file for complete search history.

(56) References Cited

U.S. PATENT DOCUMENTS

| | | | |
|---|---|---|---|
| 9,083,391 B2 | 7/2015 | Teggatz et al. | |
| 2015/0311922 A1* | 10/2015 | Bakalski | H04B 1/006 455/552.1 |
| 2017/0104508 A1 | 4/2017 | Mukundagiri et al. | |
| 2017/0272048 A1* | 9/2017 | Salfelner | H03H 7/40 |

* cited by examiner

*Primary Examiner* — Khai Tran
(74) *Attorney, Agent, or Firm* — Ronald O. Neerings; Charles A. Brill; Frank D. Cimino

(57) ABSTRACT

A programmable multi-band receiver includes a signal coupler, programmable signal scaler including a fixed capacitance part including a series set of switchable capacitor arrays positioned before Electrostatic Discharge (ESD) protecting circuitry coupled to a variable capacitance part after the ESD protecting circuitry, reconfigurable mixer array, then a baseband polyphase filter. The variable capacitance part includes a parallel set of paths each including a capacitor and at least one switch for setting a center frequency for band selection. The reconfigurable mixer array is coupled to receive phase signals from a local oscillator (LO) circuit and includes a plurality of mixer switch elements for providing image rejection. The received signal strength is adjusted by the programmable signal scaler so that the electrostatic discharge circuit (ESD) can operate without the need of a negative supply voltage.

20 Claims, 9 Drawing Sheets

MULTI-BAND PROGRAMMABLE RECEIVER

CROSS REFERENCE TO RELATED APPLICATIONS

This application claims the benefit of Provisional Application Ser. No. 62/345,300 entitled "Multi-band low latency receiver" filed Jun. 3, 2016, which is herein incorporated by reference in its entirety.

FIELD

Disclosed embodiments relate to wireless receivers for wireless power transfer applications.

BACKGROUND

Wireless data/power transfer solutions typically use near-field communications and high quality (Q) factor magnetically coupled coils (inductors) to maximize energy transfer. In this case because a power supply can render the overall solution too bulky a known concept reduces the area of the inductors, so that the coil responsible for Rx/Tx of the data path signals is physically placed inside the power coil. Two different frequencies are used for communication on the power path and the data path, respectively, where the power path uses the lower frequency and the power path signal can often be of a significantly higher magnitude as compared to the desired data signal. This coil arrangement combined with the relatively high signal amplitude of the power path signal causes the power path signal to significantly magnetically couple into the data signal in the data path.

It is desirable for the same wireless data/power transfer solution to operate at various center carrier frequencies by simple programming of the receiver front-end using a minimum circuit area. Different applications or customers may have different bands of operation that will be selected or programmed via an on-chip frequency synthesizer. As the carrier frequency of the data signal changes, such as to avoid interference or to provide faster data rates, the coil dimension is changed in the pre-design for that particular band of operation, and the magnitude of the coupled power path signal changes. For an increase in carrier frequency, the coil dimension is reduced, and the magnitude of coupling of the power path signal is reduced, while for a decrease in carrier frequency, the coil dimension is increased, and the magnitude of the coupling of the power path signal is increased. As the carrier frequency of the data communication path increases, the data throughput increases. However, more unwanted signals (blockers) need to be filtered out in order to detect the data signals with the desired signal to noise ratio (SNR).

SUMMARY

This Summary briefly indicates the nature and substance of this Disclosure. It is submitted with the understanding that it will not be used to interpret or limit the scope or meaning of the claims.

Disclosed embodiments recognize it is desirable to have the wireless data/power transfer solution operate with electrostatic discharge (ESD) protection circuitry to handle potentially damaging high amplitude signals received from the power path leading to ESD events, and the solution should provide a high image response rejection ratio (IMRR) relative to nearby mixed signals for data signals operating in spectrally dense industrial, scientific, or medical radio band (ISM) bands. A high IMRR is needed to avoid SNR degradation due to a down-converted unwanted image signal. The ESD protection circuitry (e.g., ESD diodes) are generally needed to support a large signal swing, and should generally be implemented without the need for a negative supply voltage to reduce the implementation cost of an additional charge-pump and filters generally needed to provide a clean negative supply voltage. The wireless data/power transfer solution should also be compact, reconfigurable, while providing low latency.

These design challenges are met by disclosed programmable multi-band receivers that include at least an integrated circuit (IC) portion that has the ESD protection circuitry (e.g., ESD diodes) on the chip within a programmable signal scaler, with the ESD protection circuitry positioned between a fixed series capacitor array (acting as a DC blocker) and a parallel tunable capacitor array. This arrangement provides the advantage of only needing low voltage transistors to configure the tunable capacitive array. A separate array of multiple parallel resistors can also use low voltage transistors, leading to low area, and a high quality factor implementation. The series capacitor may be placed on the chip, or can be external to the chip. Needed signal attenuation can be obtained by programming one or more of the parallel capacitor arrays in the tunable capacitor array for a specific frequency band of interest. Disclosed arrangements also provide a receiver performance advantage with less latency by maximizing the signal level tolerable without ESD damage in the particular frequency band of operation, while also maximizing the SNR for demodulation.

Various applications require programmability in terms of a different center frequency, bandwidth, image rejection, and latency of the end-to-end system for a specific power and area under budget. As the center frequency scales, the passive attenuators are also adjusted to ensure that the ESD protection circuitry elements always operate with positive supply voltage, and the switches in the tunable capacitor array used for programming the front-end center frequency and signal scaling utilize low voltage transistors, thereby enhancing the quality (Q) factor of the front-end. The configuring or calibrating of the center frequency, bandwidth, image rejection, and latency can be performed dynamically while the programmable multi-band receiver is receiving a signal, and/or can be performed at power up or while the programmable multi-band receiver is not receiving a signal.

BRIEF DESCRIPTION OF THE DRAWINGS

Reference will now be made to the accompanying drawings, which are not necessarily drawn to scale, wherein.

DETAILED DESCRIPTION

Figure 1:
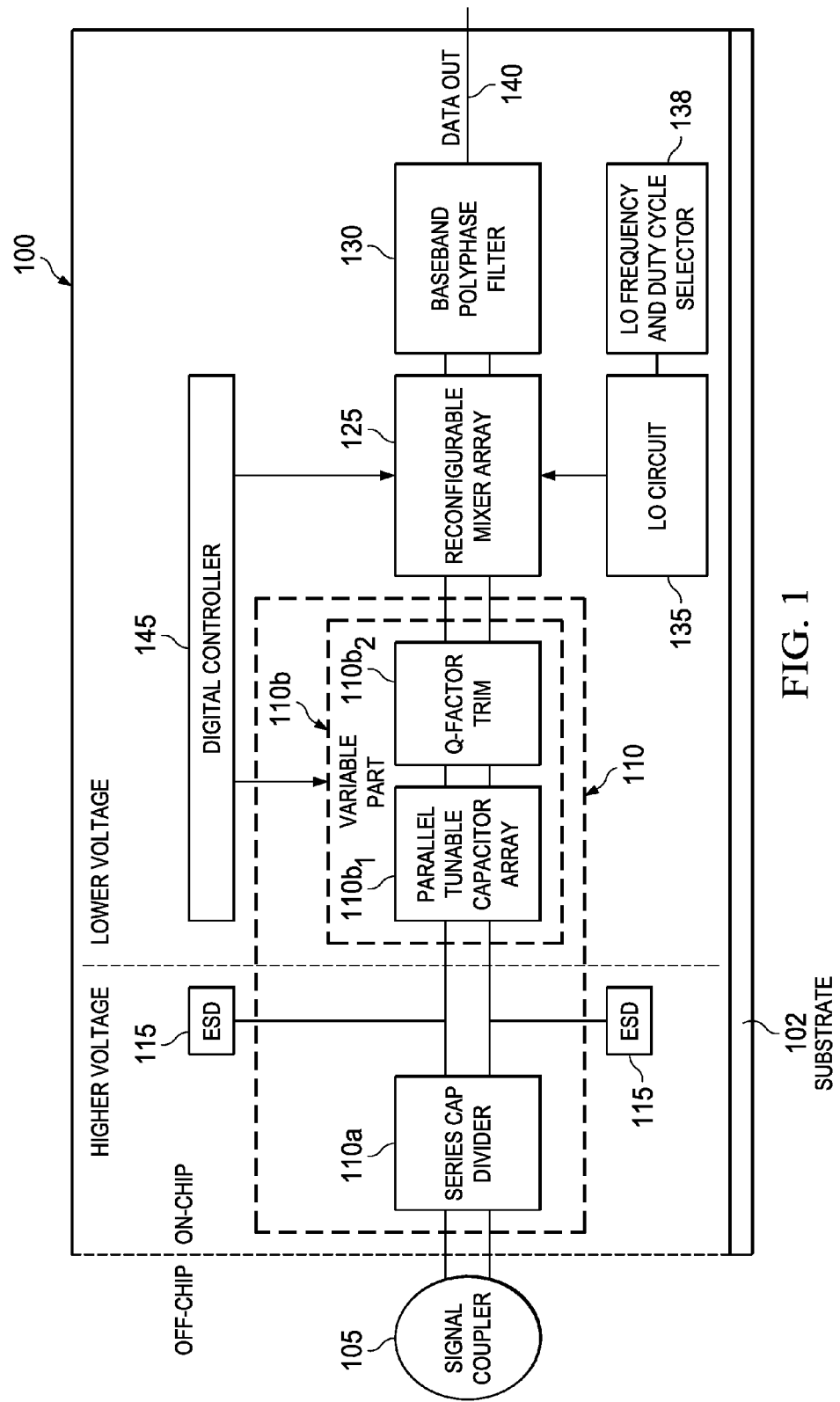
FIG. 1 shows a block diagram depiction of an example programmable multi-band receiver that has the ESD protection circuitry on the chip within a programmable signal scaler, where the ESD protection circuitry is positioned between a fixed series capacitor array and a parallel tunable capacitor array, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1 is a block diagram depiction of an example programmable multi-band receiver 100 including at least an IC portion formed on a substrate 102, according to an example embodiment. The substrate 102 has at least a semiconductor substrate, and may comprise silicon, such as epitaxial silicon on bulk silicon. Receiver 100 includes a signal coupler 105 shown off-chip coupled to provide an output that is shown double ended that is coupled to a programmable signal scaler 110. The signal coupler 105 can comprise an antenna, a resonator, an LC tank for wireless power communications (such as the coils shown in FIGS. 6A and 6B), or a transducer such as a photodetector. The output of the signal coupler 105 can also be single ended.

The programmable signal scaler 110 includes a fixed capacitance part 110a (shown as a 'series cap divider') comprising a series set of switchable capacitor arrays providing a center frequency specific attenuation positioned before the ESD protecting circuitry 115 shown coupled to both signal ends. Although the ESD protecting circuitry 115 is both shown having only one of the anode and cathode terminals connected, the other terminal of the ESD protecting circuitry 115 would be coupled to a signal ground (e.g., VDD at the top and VSS at the bottom). ESD protecting circuitry 115 can comprises diodes, NMOS transistors, thyristors, and/or silicon-controlled rectifier (SCR) devices.

As noted above, the fixed capacitance part 110a functions as a DC blocker that provides signal attenuation. ESD protecting circuitry 115 can be internal (on-chip) or external protection circuitry. ESD diodes can be on-chip and designed to withstand high voltage bidirectionally. The output of the fixed capacitance part 110a after the ESD protecting circuitry 115 is coupled to a variable capacitance part 110b. The fixed capacitance part 110a comprises higher voltage rating transistors relative to the voltage rating of the transistors in the variable capacitance part 110b. The variable capacitance part 110b comprises a parallel tunable capacitor array $110b_1$ including a parallel set of paths each including a capacitor and at least one switch, as well as an optional Q-factor trim block $110b_2$.

As noted above, the tunable capacitor array $110b_1$ is for adjusting/trimming the center frequency. The tunable capacitor array $110b_1$ can also provide a predetermined center frequency specific signal attenuation, and once the center frequency is set using its switches, another parallel set of capacitor arrays can be used to trim (to fine adjust) the center frequency. One or more parallel capacitor 'runs' may be enabled to cover different center frequencies. The parallel tunable set of switchable paths each including a capacitor and at least one switch on tunable capacitor array $110b_1$ can comprise capacitive ladder structures which can be controlled by metal-oxide-semiconductor field-effect transistor switches (MOS switches; see FIG. 2B described below) which provide a low on resistance (RON), while fuses (one-shot capacitance adjustment) are also possible for setting of the capacitance for uses involving a single band. Low voltage MOS switches can be used to maximize the Q factor of the receiver front-end, leading to low power operation.

For multi-band uses to enable operating at various center frequencies, the tunable capacitor array $110b_1$ generally comprises capacitive ladder structures controlled by MOS switches. The parallel tunable capacitor array $110b_1$ is for together with the coil (as the signal coupler 105) controlling a quality (Q) factor of this LC combination, and can comprise a set of on-chip resistors coupled by capacitors configured for capacitive trimming using low voltage MOS switches. The programmable signal scaler 110 can provide a precisely controlled attenuation step to perform the signal processing using the front-end as both the capacitors in fixed capacitance part 110a and variable capacitance part 110b can be of the same type, and no additional process compensation is generally needed. Compact construction of the receiver 100 can be accomplished by using metal-metal capacitors for the capacitors in the programmable signal scaler 110. The metal-metal capacitors can be placed close to the bond-pads on the substrate 102, and can include placing some of the capacitors directly over the ESD protecting circuitry 115 (such as ESD diodes).

Outputs from the variable part 110b of the programmable signal scaler 110 are coupled to inputs of a reconfigurable mixer array 125 comprising a plurality of mixer switch elements that provide down-conversion stages. The reconfigurable mixer array 125 can have N stages of mixers in cascade, using either a differential phase (0 and 180 degrees) or (90 and 270 degrees), or a differential quadrature phase (0 and 180 degrees) and (90 and 270 degrees). A LO frequency is generated using a phase locked loop (PLL) and duty cycle selector block 138 shown coupled to the LO circuit 135 to control its frequency duty cycle by using pre-determined or programmable settings from a digital controller 145 or via a state machine. The reconfigurable mixer array 125 receives inputs from the LO circuit 135. Although not shown, a programmable gain block can be added between the programmable signal scaler 110 and the reconfigurable mixer array 125. For a disclosed reconfigurable mixer array with N down-conversion stages, two outputs from any of the (N–K) stages (K=1, 2, . . . N–1) can be combined in order to perform image rejection. For example, if the outputs of the M-th stage is combined using one of the formulations described below, image rejection can be obtained by eliminating either the upper sideband or the lower sideband.

The mixer switches comprising multiple switches in parallel can be programmed to provide variable gain at the RF carrier frequency. Image rejection as known in the art is a measure of a receiver's ability to reject signals at its image frequency. Image rejection can be important at the center frequencies in the ISM bands. The IMRR is normally expressed as the ratio, in dB, of the receiver's sensitivity at the desired frequency versus the sensitivity at the image frequency.

Outputs from the reconfigurable mixer array 125 are coupled to inputs of a baseband polyphase filter 130 that comprises two parallel paths (see FIG. 4 described below). The first path comprises passive components configured to provide a polyphase low-pass filter and the second stage being cascaded active polyphase stages. Appropriate orientation implies rejection of upper sideband, and lower sideband.

The baseband polyphase filter 130 can reject an up-converted blocker signal (at e.g., 6.78 MHz for a wireless transceiver upconverted to a frequency of $f_{LO}$+6.78 MHz), where $f_{LO}$ is the LO frequency. The baseband polyphase filter 130 may be preceded by a gain stage, such that the noise contributions from the filter does not impact the front-end sensitivity, and the signal loss through the passive stage is compensated for the needed gain budget of the receiver. Outputs from the baseband polyphase filter 130 shown as data out 140 are generally interfaced to a detector that provides signal demodulation using direct coupling, and a fixed signal is generally needed at the input of the detector for reliable operation. There is limited filtering possible from the baseband polyphase filter 130, and it generally provides very low latency due to its wide bandwidth. A second path of the baseband polyphase filter 130 can optionally also include a plurality of cascaded active stages. Some of the active stages can optionally be configured to be powered down generally depending on power consumption or how much filtering is needed vs. a tradeoff in latency.

The data out 140 may be at a frequency around 80 MHz in one particular embodiment. Data out 140 is generally coupled to a detector comprising a programmable signal demodulator such as a programmable slicer array receiving digital mapper inputs and comprising threshold comparators, then a digital combiner for combining M outputs to a single data output to become x=1 (single ended) or differential x=2, then going to a digital processor/engine. Various configurations are possible in the baseband polyphase filter 130. Configurations include (a) only the passive polyphase stage activated, (b) only the active polyphase stage activated (c) only the active polyphase stage activated and the active polyphase stage is configured into a real filter, and (d) both the passive and active stages are activated, and connected to the outputs of the two different mixer stages. In configuration (d), the architecture itself can be configured to receive two channels simultaneously.

Both the passive polyphase filter and the active polyphase filter stages of a disclosed baseband polyphase filter 130 are generally reconfigurable with respect to their bandwidth (e.g. latency, where a higher bandwidth implies lower latency), and the selection of sideband. Using a fully differential configuration, and existing virtual grounds of the operational transconductance amplifiers (OTAs), signals can be summed or subtracted at the low impedance nodes to select the upper or lower sideband. This decision is dependent on the location of the blocker and selection of the LO frequency. For example, an RF signal around 315 MHz may be down-converted using 318 MHz LO signal (high side injection), resulting in an image signal at 312 MHz, and the lower sideband image can be cancelled by the proper combination of the ± and the ∓ terms using the current mode outputs of the reconfigurable mixer array 125.

Outputs of the mixer switches in the reconfigurable mixer array 125 are provided to baseband chains in the baseband polyphase filter 130, where each baseband chain can process real signals using a cascade of active filters. However, as the active filters consume power and provide higher latency (depending on the RC time constant and the gain-bandwidth of their OTAs), as noted above some of the active stages can be powered down, and the polyphase filter stages of the baseband polyphase filter 130 can be reconfigured by simple MOS switches towards a complex or real passive polyphaser filter.

The programmable multi-band receiver 100 is also shown including a digital controller 145. The digital controller 145 can reconfigure all aspects of (a) architecture (e.g., single channel or simultaneous multi-channel), (b) center frequency for RF front-end and baseband bandwidth for each frequency band and application under consideration, (c) reconfiguration and calibration of the programmable gain of the front-end to ensure a fixed signal amplitude at the input (d) reconfiguration of mixer elements for image rejection (complex signal processing) or not (real signal processing). Most of the functionalities are "static" in nature (e.g. can be performed at power up), while some functionalities can be dynamic. For example, one of the two parallel paths of the baseband polyphase filter 130 may be used to dynamically calibrate another, in terms of signal strength and bandwidth. Digital controller 145 is coupled to the variable part 110b including the tunable capacitor array $110b_1$ and to the reconfigurable mixer array 125 for at least tuning the tunable capacitor array $110b_1$ and programming the reconfigurable mixer array block 125.

Figure 2A:
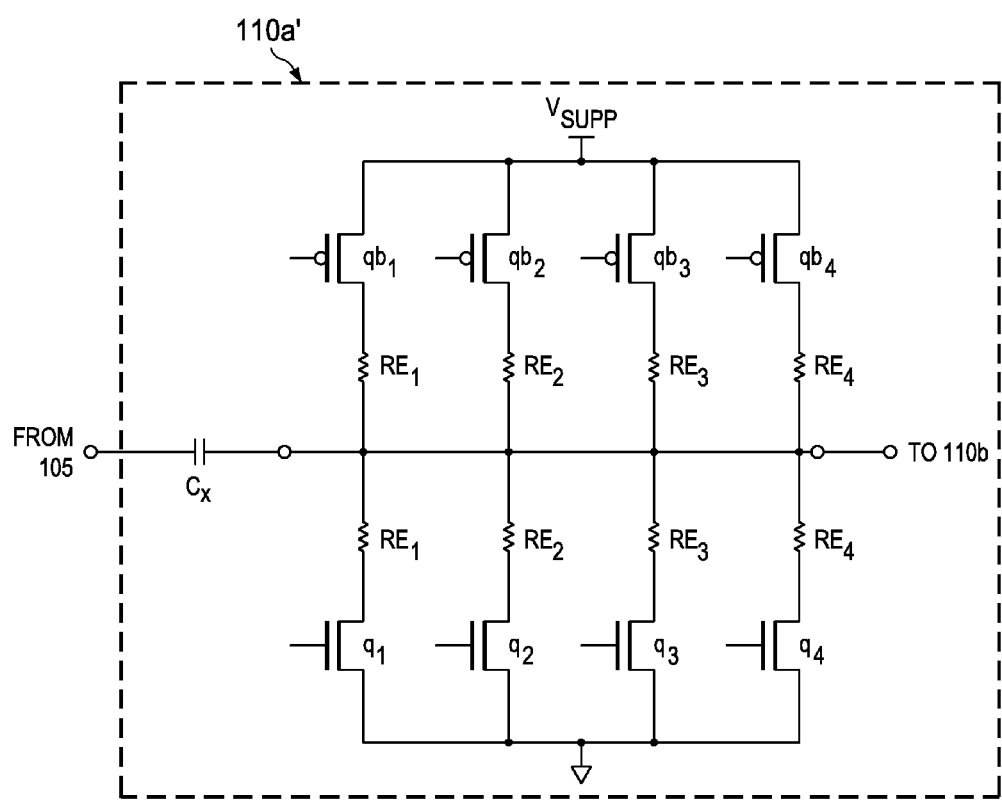
FIG. 2A depicts an example fixed capacitance part of a disclosed programmable signal scaler, with a series capacitor Cx shown between the signal coupler and the fixed series capacitance part, where the fixed capacitance part also includes a set of programmable resistor banks connected to a low voltage on-chip power supply ($V_{SUPP}$).

Optionally the digital controller 145 can also provide calibration. FIG. 2A depicts an example fixed capacitance part 110a' of a disclosed programmable signal scaler 110 that acts as a DC blocker. A series capacitor shown as Cx is between the signal coupler 105 and the fixed capacitance part 110a' that provides some DC blocking. Cx can be an internal capacitor (to the IC) or be external, where Cx renders all signals after its node to be at a lower voltage, and thus enabling combining capacitive tuning for realizing a plurality of bands in the variable capacitance part to provide a cost competitive and compact multiband receiver solution.

The fixed capacitance part 110a' is shown including a resistor array shown as $RE_1$, $RE_2$, $RE_3$ and $RE_4$ each in series with a transistor shown as $qb_1$, $qb_2$, $qb_3$, and $qb_4$, and resistors shown as $RE_1$, $RE_2$, $RE_3$ and $RE_4$ each in series with a transistor shown as $q_1$, $qb_2$, $q_3$, and $q_4$ between the signal path and the ground node shown. The output of the fixed capacitance part 110a' is shown coupled to variable part 110b. The switches shown in FIG. 2A are used to enable by setting the bias voltage (via resistors $RE_1$, $RE_2$, $RE_3$ and $RE_4$) which is additional help in setting the ESD bias voltage correctly to the output of the fixed capacitance part 110a' which the ESD protecting circuitry 115 would experience.

Figure 2B:
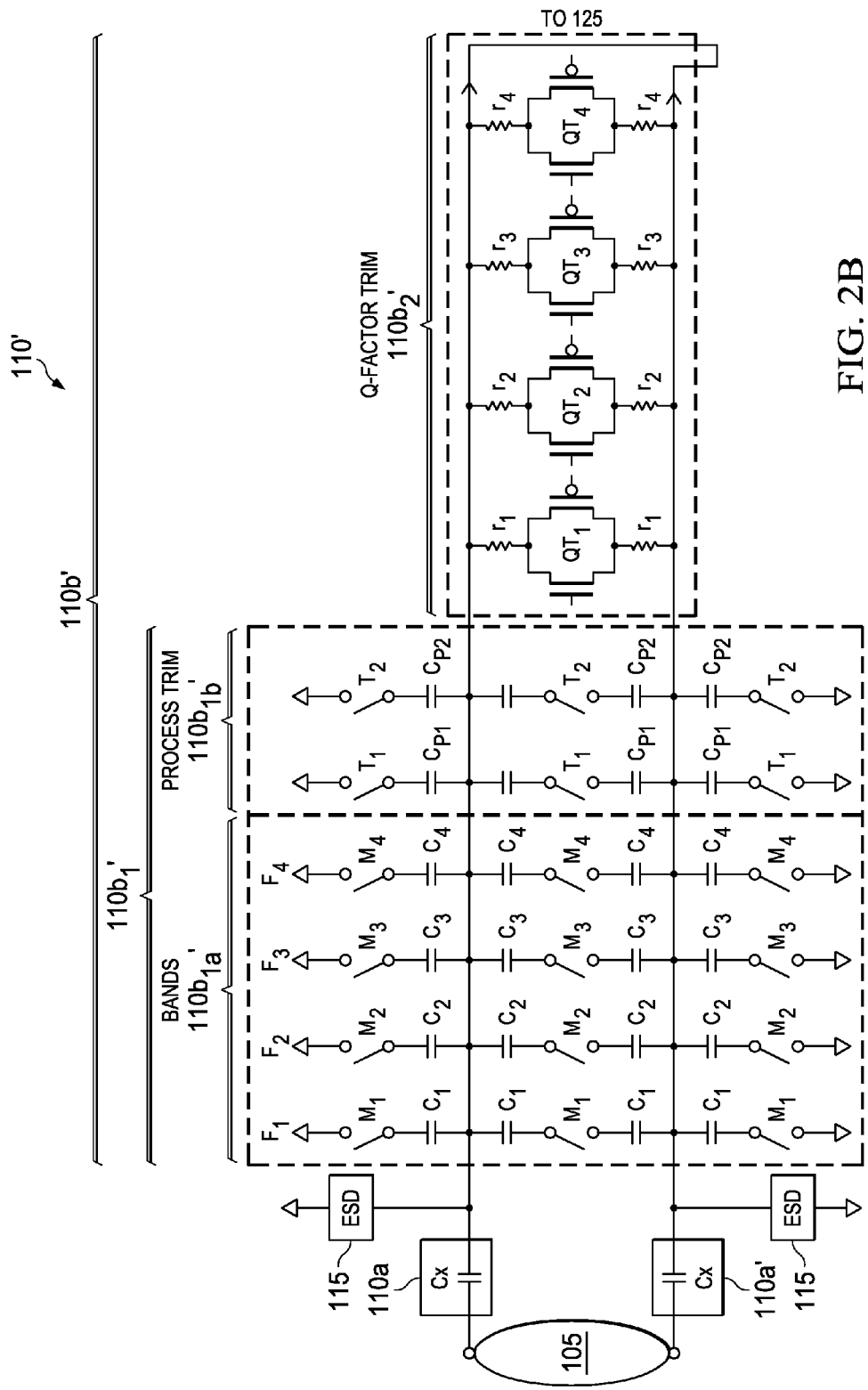
FIG. 2B shows an example programmable signal scaler that provides on-chip reliable signal scaling for reliable ESD operation by biasing with a precise on-chip DC voltage, where the tunable capacitor array part is shown including process trimmers and Q-factor trimmers, according to an example embodiment.

FIG. 2B shows an example programmable signal scaler 110' that provides on-chip signal scaling for reliable ESD operation by biasing with a precise on-chip DC voltage, where the variable part 110b' is shown including a parallel tunable capacitor array 110b$_1$' comprising bands 110b$_{1a}$' and process trimmers 110b$_{1b}$', and Q-factor trimmers 110b$_2$' that comprise a set of resistors in series with at least one trim switch. The F1 to F4 in the bands 110b$_{1a}$' are different frequency bands of receiver operation. Based on the frequency band of receiver operation and signal coupler 105 (e.g., antenna) used, the various bits from the digital controller 145 can be used to select the band and perform process trims and Q-factor trims (e.g., see $QT_1$ to $QT_4$ which are CMOS trim switches shown in FIG. 3C) electronically.

Figure 3A:
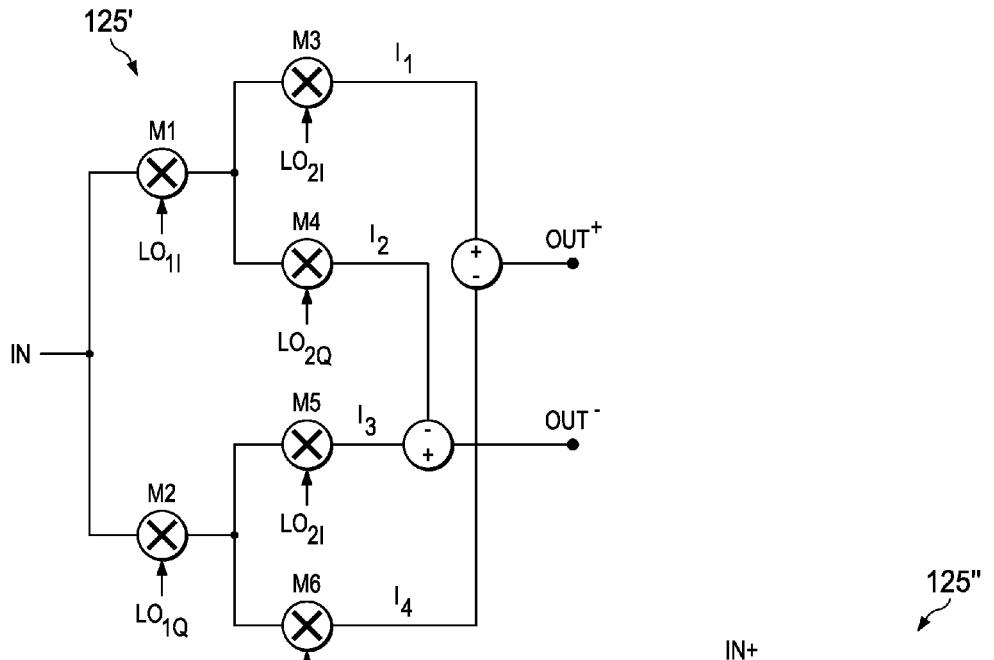
FIG. 3A depicts an example multi-stage reconfigurable mixer array.

FIG. 3A depicts an example reconfigurable mixer array 125'. Reconfigurable mixer array 125' as described above receives I and Q inputs from the LO circuit 135. The first set (down-conversion stage) of mixer elements M1, M2 in the reconfigurable mixer array 125' receive differential RF signals from the front-end (directly from the signal coupler 105 or coupled via an amplifier), represented as RF ∠0° and RF ∠180°. The first mixer M1 is switched with quadrature LO phases at frequency $F_{LO1}$, and provides outputs at $IF_1 \angle 0°$, $IF_1 \angle 180°$, $IF_1 \angle 90°$, $IF_1 \angle 270°$ where $IF_1 = RF - F_{LO1}$. The RF inputs may be single ended and/or the LO waveforms could be of 25% duty cycle. The second set (stage) of mixers are shown as M3, M4, M5 and M6. This mechanism can be made for all the stages, and at the final output (OUT+, OUT−) the currents (I) are combined using the following formula:

$$IF(I) = I_1 \pm I_4 \text{ and}$$

$$IF(I) = I_2 \mp I_3$$

Where, $I_1$, $I_2$, $I_3$, $I_4$ shown in FIG. 3A indicate the final current outputs from the N mixer stages.

Figure 3B:
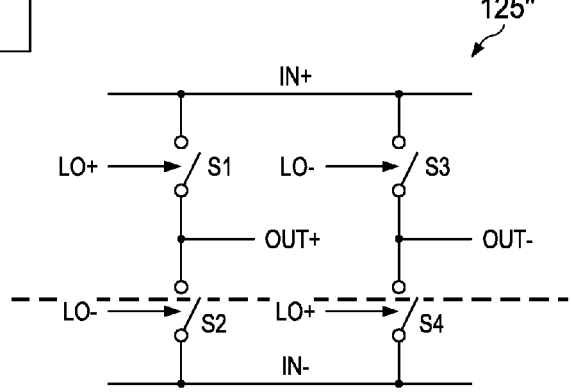
FIG. 3B illustrates an implementation of a reconfigurable mixer array.

FIG. 3B illustrates an implementation for an example reconfigurable mixer element shown as 125". The reconfigurable mixer element 125" receives differential input signals IN+ and IN− and produces differential output signals OUT+ and OUT−. These inputs at RF frequency may be single ended as well, and in that case the second input is connected to a constant potential (typically supply, ground, or half the supply potentials). Alternatively, the portion of this circuit below the dashed line shown can be removed. OUT+ is selectively connected to IN+ by Switch S1 and is also selectively connected to IN− by Switch S2. Similarly, OUT− is selectively connected to IN+ by Switch S3 and is also selectively connected to IN− by Switch S4.

Switches S1 and S4 are clocked by the Signal LO+, while Switches S2 and S3 are clocked by the Signal LO−. This means that when LO+ is high, OUT+ is connected to IN+ and OUT− is connected to IN−. Likewise when LO+ is low, OUT+ is connected to IN− and OUT− is connected to IN+. The alternation at frequency LO provides outputs equal to $|F_{LO} + F_{RF}|$ and $|F_{LO} - F_{RF}|$.

Figure 3C:
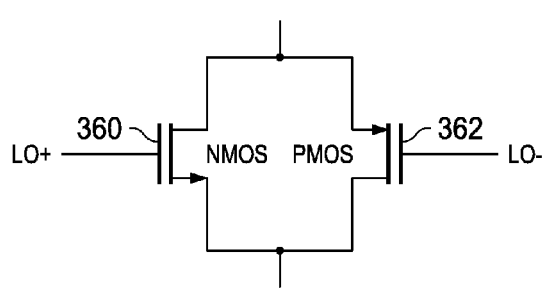
FIG. 3C depicts switches implemented by class AB style NMOS/PMOS parallel switches.

In at least one embodiment each of switches S1-S4 is implemented by class AB style NMOS/PMOS parallel switches as shown in FIG. 3C. The choice of switch configuration is dependent on the common mode of the baseband stages. If the input stages of the baseband polyphase filter 130 include NMOS transistors, then the mixer switches are of PMOS type and vice versa. However, when the input (and the output) common modes of the baseband stages of the baseband polyphase filter 130 are set at half the supply voltage, the mixer switches can use both NMOS and PMOS transistors in parallel.

The use of such parallel switches will accommodate rail-to-rail operations. In one embodiment as shown in FIG. 3C, NMOS Transistor 360 is clocked, for example, by LO+ and PMOS Transistor 362 is clocked by LO−. In this embodiment, the two clock signals may be overlapping or non-overlapping. In at least one embodiment, both the NMOS and PMOS transistors in the mixer are provided with the same waveform but 90° phase shifted. In this embodiment, the reconfigurable mixer array provides an intrinsic "frequency doubler" functionality, and may be clocked from a lower LO frequency, leading to lower power and superior I/Q balance.

Figure 3D:
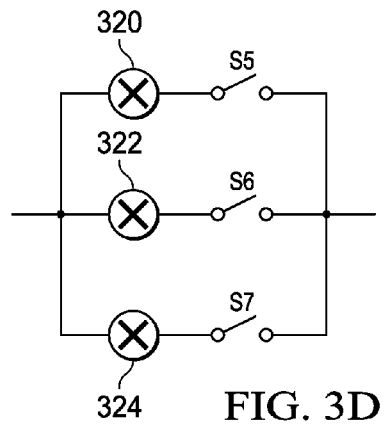
FIG. 3D depicts automatic gain control (AGC) functionality implemented in disclosed receivers using different ON resistors in different embodiments of mixers, where the mixer is implemented as a mixer combination which includes mixer sections connected in parallel, where a determination can be made dynamically to select an appropriate one of mixer sections using the mixer switches.

Automatic gain control (AGC) functionality can be implemented in disclosed receivers using different methods, with one method illustrated in FIG. 3D where AGC can be implemented by using different ON resistors in different embodiments of mixers. In an example shown in FIG. 3D, the reconfigurable mixer array is implemented as a mixer combination which includes mixer sections 320, 322, 324 connected in parallel. A determination can then be made dynamically to select an appropriate one of mixer array sections 320, 322, 324 using switches S5, S6, S7.

Figure 4:
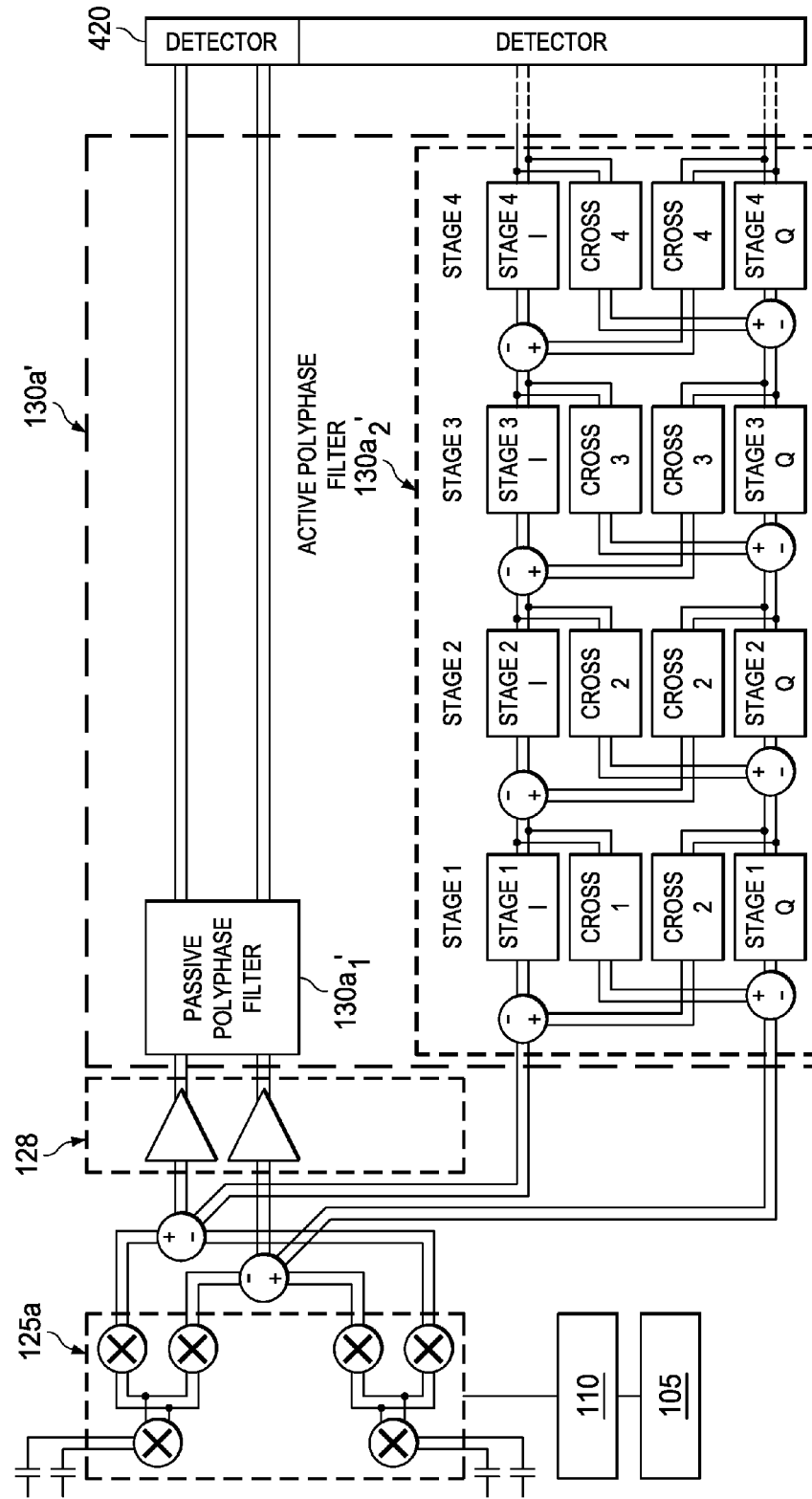
FIG. 4 illustrates a portion of an example receiver architecture including a reconfigurable mixer array and a baseband polyphase filter providing a loopback re-configuration using a combination of image reject with 2 mixer channels for the reconfigurable mixer array with synchronous and asynchronous schemes, according to an example embodiment.

FIG. 4 illustrates a portion of an example programmable multi-band receiver architecture including a reconfigurable mixer array 125a coupled to a baseband polyphase filter 130a' providing a loopback re-configuration using a combination of image reject with 2 mixer channels for the reconfigurable mixer array 125a with synchronous and asynchronous schemes. Outputs from the baseband polyphase filter 130a' are shown coupled to a detector 420. There is an optional gain stage provided by the amplifier block 128 shown between the reconfigurable mixer array 125a and a passive polyphase filter portion 130a$_1$' of the baseband polyphase filter 130a'. Baseband polyphase filter 130a' is also shown including an active polyphase filter portion 130a2' that is in parallel to the passive polyphase filter portion 130a$_1$'.

Image rejection maybe achieved by only the reconfigurable mixer array 125, or the baseband polyphase filter 130, or both. When the image rejection is achieved using the reconfigurable mixer array 125 only, it is referred to as "synchronous scheme" as the image rejection is a function of the accuracy of the clock waveforms (in terms of phases and duty cycle). Image rejection at the baseband polyphase filter 130, however, generally does not require a clock, where accurate RC time constants are sufficient. This is referred to as "asynchronous image rejection" as it doesn't require a clock. However, the asynchronous operation is aided by the clock waveforms, as the quadrature should generally be defined accurately to take advantage of a superior image rejection performance.

The baseband polyphase filter 130a' is shown in FIG. 4 by example including an active polyphase portion 130a$_2$' including 4 cascaded active stages shown as stage 1, stage 2, stage 3 and stage 4. Each of the active stages implements a biquadratic transfer function, and depending on the transfer function may exhibit a low pass function or a band pass function. Other frequency responses (high pass and band stop) are possible. The first stage of the baseband polyphase filter 130a' is directly coupled to the outputs of one of the mixer stages where both the mixer and polyphase filter first stage are generally common mode compatible. The amplifier used to implement the filter shown as amplifier block 128 may use the same common mode at the input and the output, and the mixer array may be implemented using a parallel combination of low voltage compatible NMOS and PMOS switches to operate with a common mode set to be substantially equal to half of the supply voltage in order to achieve maximum signal swing.

All the subsequent stages in the baseband polyphase filter 130a' may use a multiple feedback filter topology, and use a series capacitor which blocks DC voltages. Hence, the cascaded chain of polyphase filters does not require a DC offset compensation digital to analog converter (DAC). Outputs from each of the stages of the baseband polyphase filter 130a' are directly coupled to the demodulating detector 420, eliminating any need for common mode shifters. Both of these aspects reduce power, area, and calibration difficulties for the baseband filter.

The filter chain for the baseband polyphase filter 130a' maybe configured in two ways: (a) real signal processing, (b) complex signal processing. In real signal processing, the filter is configured in a low pass equivalent, and the cross-coupling network between the two stages are deactivated, and a symmetric low pass frequency response is obtained. In complex signal processing, the cross-coupling network between the two stages are activated, and the filter exhibits an asymmetric frequency response (e.g. passes positive frequency and blocks negative frequency). This aspect attenuates the image further, and more accuracy maybe achieved by calibration. As the image rejection is obtained by adjusting the bandwidth (a function of resistance and capacitances), the image rejection is performed without the need of clock, and is attributed as 'asynchronous operation'. Calibration is implemented using commonly known schemes, and reconfiguration of the hardware to suit the needs of multiple band/standard are performed by software programming.

Figure 5:
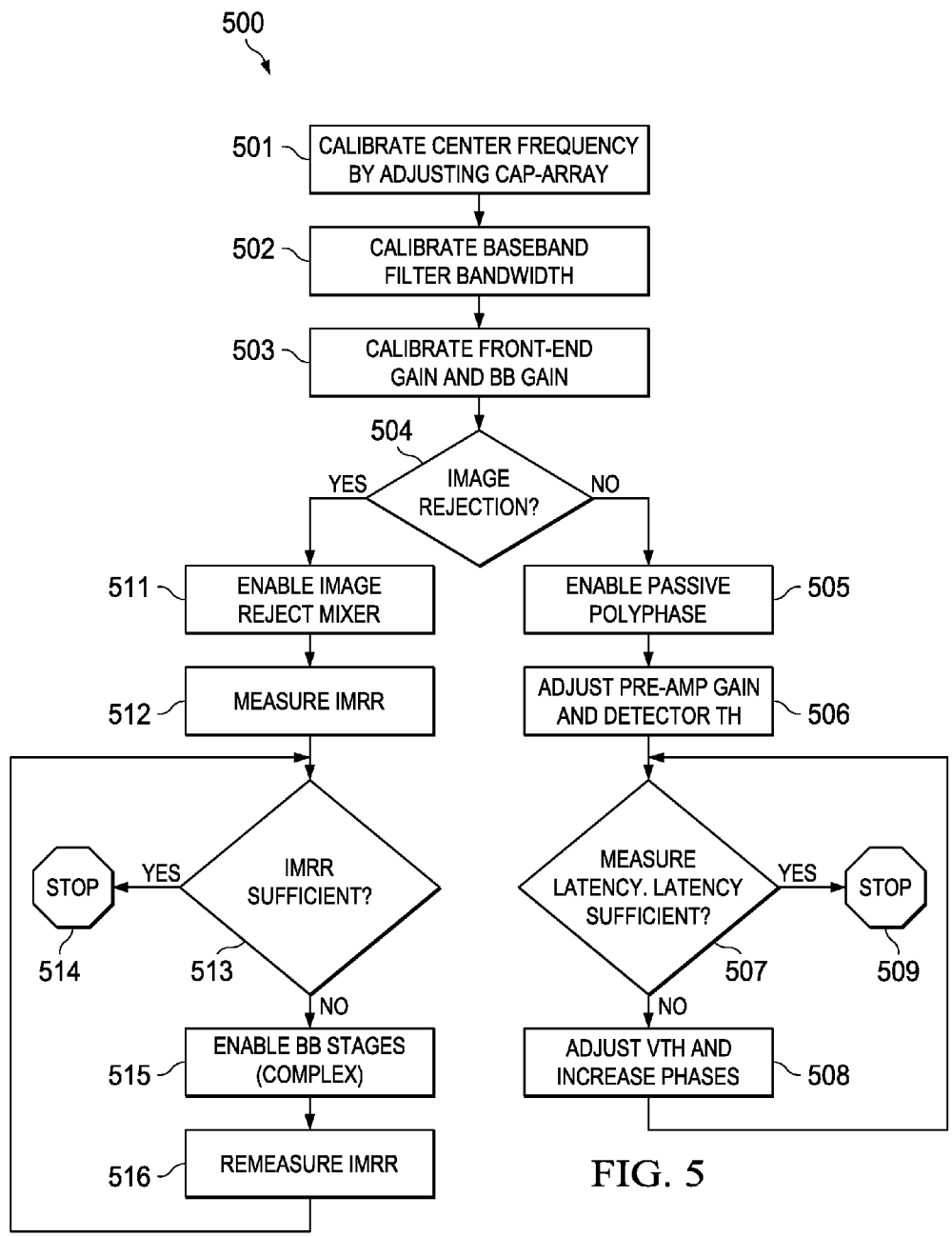
FIG. 5 is a flow chart that describes the control operations for a disclosed programmable multi-band receiver provided by a disclosed digital controller.

FIG. 5 is a flow chart 500 that describes the control operations for a disclosed programmable multi-band receiver provided by a digital controller 145. First, the center frequency is calibrated 501 by changing the programming code to the switches to control the variable capacitance part 110b of the L/C tank circuit. This is typically performed by a precise tone injection at the front-end tank circuit where the tone is related to an accurate frequency generation block (e.g. crystal oscillator). Next, the bandwidth of the baseband polyphase filter 130 is calibrated 502 to the desired value. Afterwards, the gain of the front-end and the baseband polyphase filter 130 is calibrated 503. A calibration can simply comprise reading values of the desired quantity from a look up table, application of the stimuli, and measuring the corresponding result in the digital baseband domain.

After the calibrations are performed, then, depending on the frequency band of programmable multi-band receiver operation and the LO circuit 135 injection frequency (along with upper and lower side injection), it is determined whether image rejection is necessary 504. If image rejection is determined to not be necessary, the architecture is configured for lowest latency using the baseband polyphase filter 130 which is enabled in step 505. The gain block preceding the passive polyphase filter (see the amplifier block 128 in FIG. 4) is responsible for turning that path ON or OFF. When the passive polyphase filter path of the baseband polyphase filter is activated, the preceding amplifier gain and the detector thresholds are adjusted in 506, and the resulting signal latency is measured in 507. If the latency meets the requirement, the method stops 509. If the latency is higher than the requirement, detector threshold voltage is adjusted in 508, and number of phases used for detection is increased for faster detection. This process is continued until the desired latency is met.

When image rejection is needed by programmable multi-band receiver, first the image reject mixer path in the mixer array is enabled 511, and the IMRR is measured 512. The IMRR is tested in 513 to see if it is sufficient. If the IMRR is sufficient, the method stops 514. If the IMRR is not sufficient, in 515 the baseband filter stages in the baseband polyphase filter 130 are enabled, one at a time. More stages lead to higher latency, and enabling only the stages that are necessary for filtering, reduces the overall latency of the filter path, while achieving lower power. The rest of the states may simply be bypassed, or the detector may be distributed along the chain, in order to reduce latency. This process is continued with re-measuring the IMRR until the desired IMRR is achieved at the lowest possible latency.

Figure 6A:
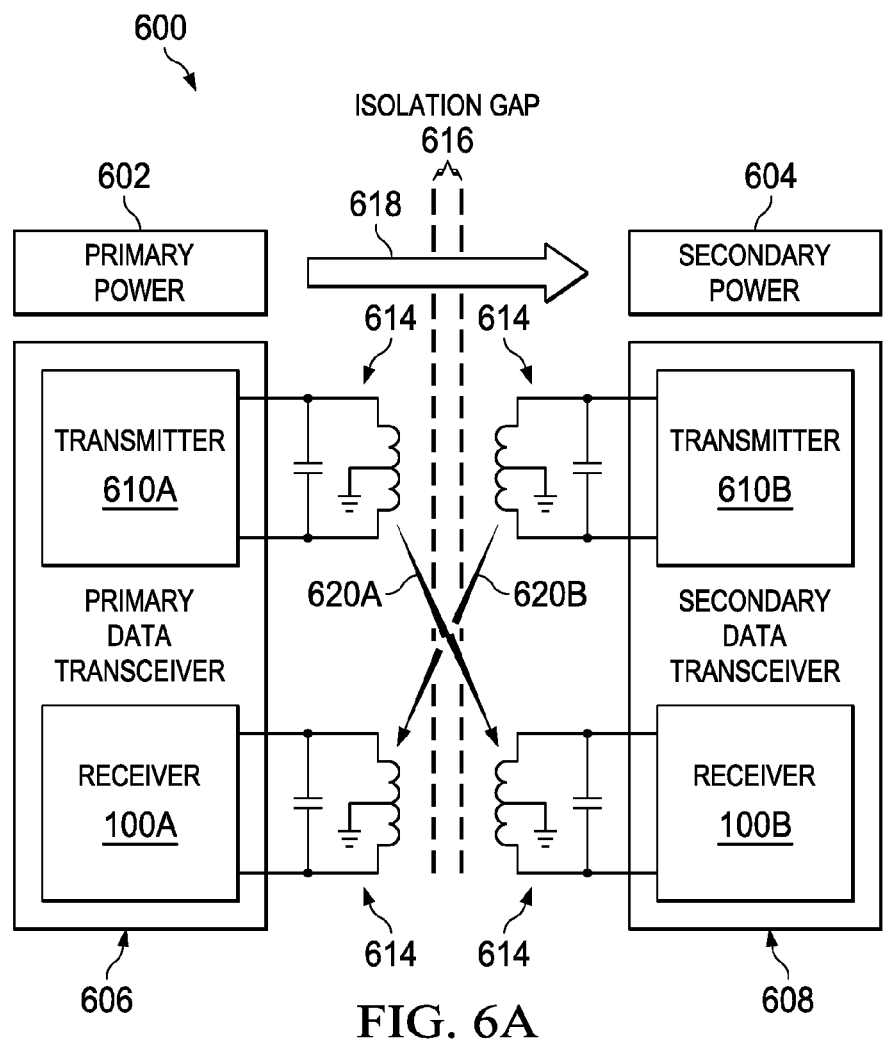
FIG. 6A shows a high level block diagram for a system for wireless power and data transmission including a primary data transceiver and a secondary data transceiver providing wireless power transfer that each include a disclosed programmable multi-band receiver.

A contactless interface transceiver can include a disclosed programmable multi-band receiver, such as programmable multi-band receiver 100. FIG. 6A shows a high level block diagram for a system for wireless power and data transmission 600 including primary and secondary data transceivers 606, 608 providing wireless power transfer that each include a disclosed programmable multi-band receiver shown as receiver 100A and 100B, respectively.

System 600 is for isolated power and data transfer. Primary data transceiver 606 includes a Primary Power block 602, which is physically separated from the Secondary Power block 604 by an isolation gap 616. Power is transmitted from Primary Power block 602 to the Secondary Power block 604 at a known relatively low frequency as wireless signal 618. In at least one embodiment, the power is transmitted at a frequency of 6.78 MHz.

The Primary Data Transceiver 606 includes a Transmitter 610A and Receiver 100A that are each connected to an Inductor-Capacitor (LC) tank 614. Secondary Data Transceiver 608 includes Transmitter 610B and Receiver 100B, each of which is also connected to an LC tank 614. Communication between the primary side and secondary side of the system 600 takes place across Isolation Gap 616 in full duplex communication, i.e., Transmitter 610A transmits to receiver 100B as Signal 620A and Transmitter 610B transmits to receiver 100A as Signal 620B. In at least one embodiment, Receivers 100A and 100B can be identical circuits. In at least one embodiment, the isolation gap 616 measures in the range from 1 mm to 2.5 mm. In at least one other embodiment, the isolation gap 616 measures up to several tens of mms.

Figure 6B:
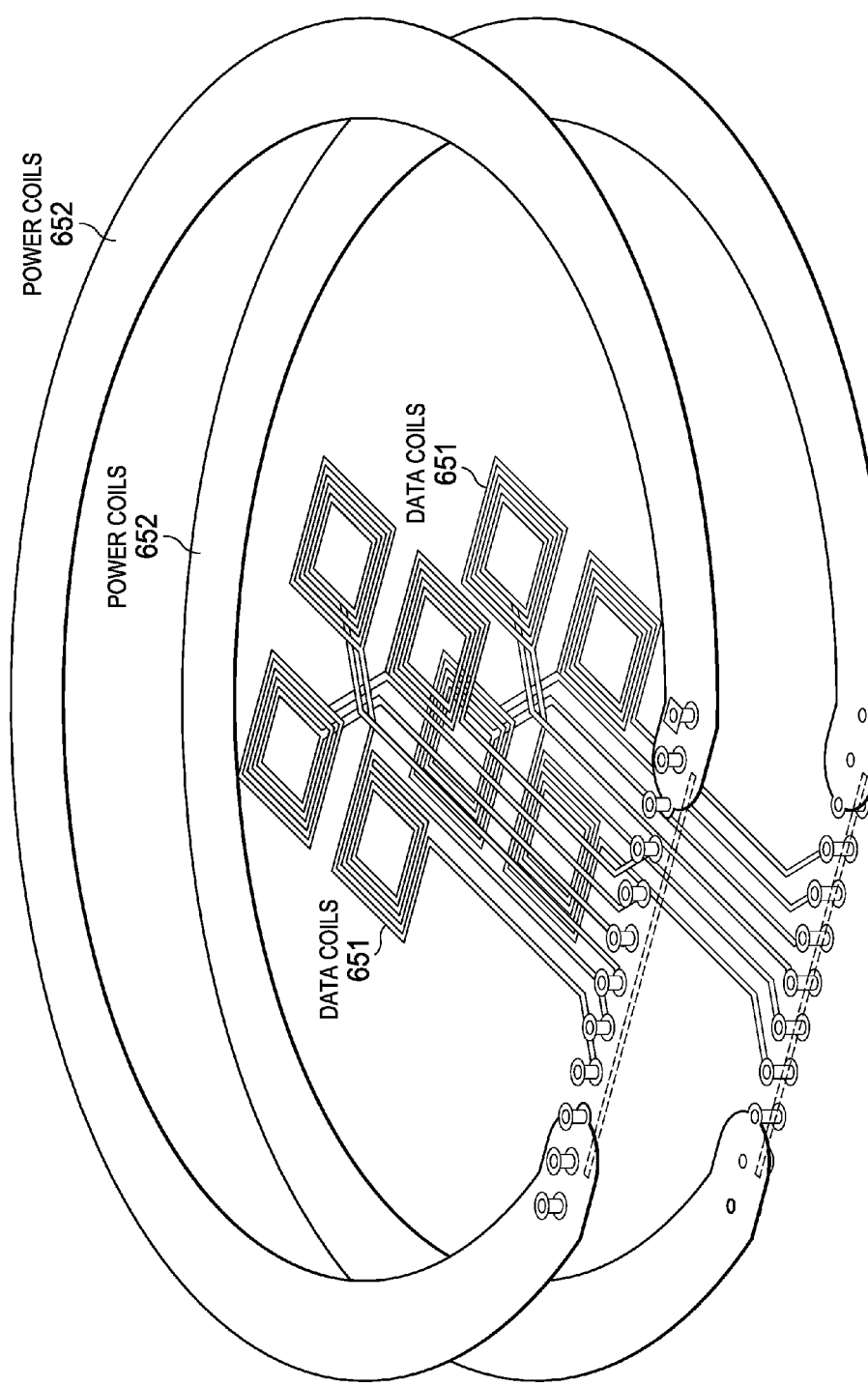
FIG. 6B shows the L in the LC tanks of the data transceiver comprising data coils enclosed inside outer power coils whose power signal gets coupled onto the data coils on its resident side.

As described above there is a challenge in the design of a wireless receiver that is part of a wireless power transmission system such as system 600, particularly when the data coils responsible for Rx/Tx of the data signals are physically placed inside the power coils such as shown in FIG. 6B described below that leads to the potential magnetic coupling of the wireless power path signal in with the data signal in data path. As seen in FIG. 6A system 600 comprises a primary power side and secondary power side, that although shown as a single coil for the Tx and a single coil for the Rx, the single coils may be pairs of coils on each side, one pair for the transmitter (Tx) and other for the receiver (Rx) which allow it to be a full-duplex system. The primary and secondary coils face each other and the data coils are magnetically coupled allowing simultaneous transmission and reception of data.

As shown in FIG. 6B the L in the LC tanks of the data transceiver can comprise data coils shown as 651 that are enclosed inside the power coils 652 whose power signals during operation thus gets coupled onto the data coils 651 on its resident side. The data transmission/reception is also possible with the data coils 651 in a full/half duplex configuration and without the power coils 652 present.

Without a receiver such as Receiver 100A and 100B, power harmonics of the Signal 618 provide a relatively strong blocker signal at a frequency $F_{PWR}$, which can be at 6.78 MHz, that due to magnetic coupling over a distance that may be only about 20 mm tends to 'swamp' out any data signals at frequency $F_{DATA}$, which can be at 80 MHz±2 MHz. To recover the transmitted data, unwanted components that are coupled to the received data in the data path should be removed, such as the unwanted blocker signal at 6.78 MHz, as well as any other noise that may be present in the environment that gets also coupled in. Based on the power transmitted and the separation distance in the example embodiment, a minimum blocker suppression of 40 dBc may be needed. Receivers 100A and 100B provide at least this level of blocker suppression.

Figure 7:
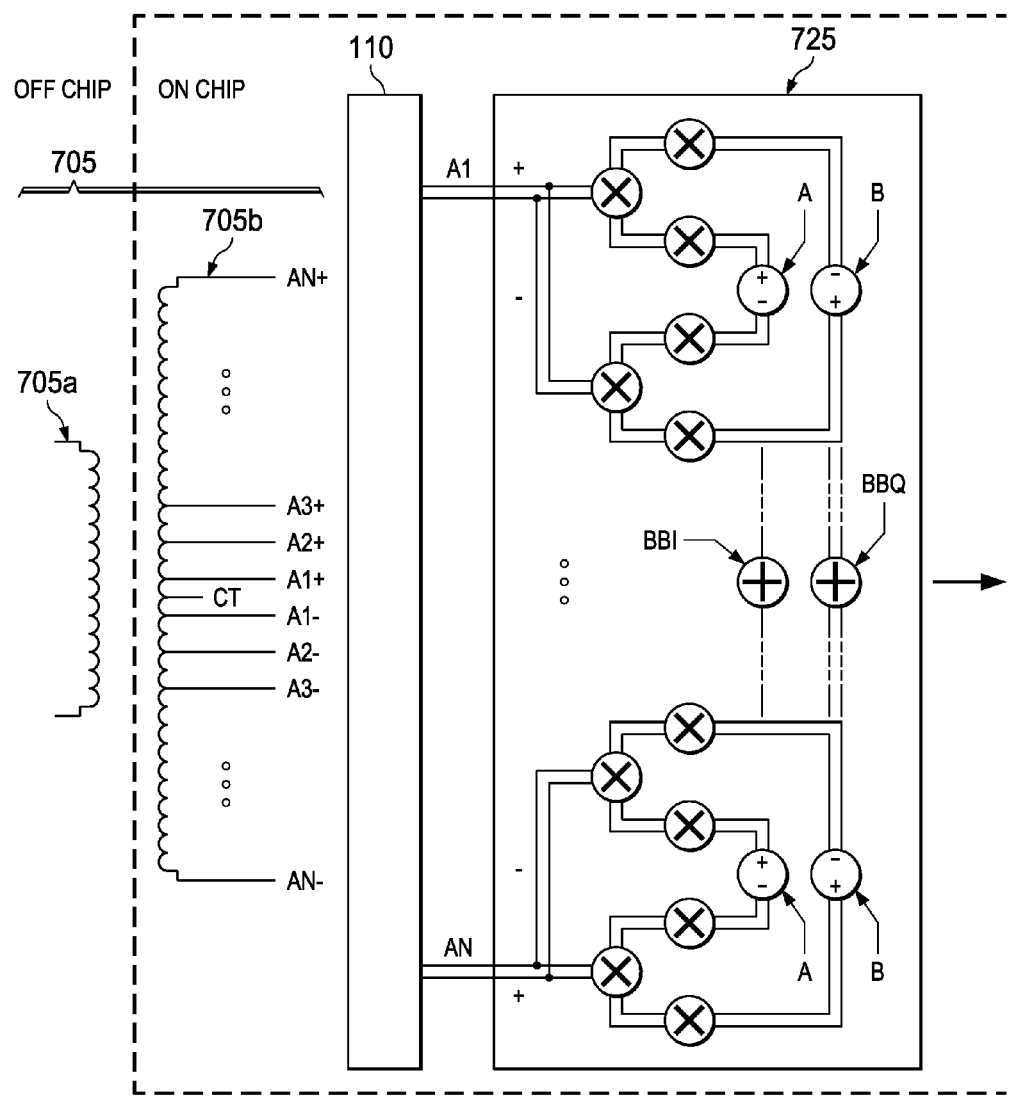
FIG. 7 illustrates an alternate signal coupler arrangement for coupling to the front-end of a disclosed programmable multi-band receiver.

FIG. 7 illustrates an alternate signal coupler arrangement shown as 705 that provides coupling of signals with inductive signal attenuation to the front-end of a disclosed programmable multi-band receiver. In this configuration, the data coil 705a used for the programmable multi-band receiver resides outside the chip and couples to an on-chip inductor 705b.

Inductor 705b can be tapped using N points located symmetrically from its physical symmetry point (typically its center tap). The center tap may or may not use a DC bias voltage. Each of the differential signals shown (e.g., A1−, A1+, . . . ) are coupled to a programmable signal scaler 110 that provides outputs to switchable mixer elements of a reconfigurable mixer array shown as 725 that provides N outputs. The mixer elements output current is summed as shown, leading to a compact implementation of programmable gain in the front-end of the receiver. The N outputs of the reconfigurable mixer array 725 can be configured via a digital controller (see digital controller 145 in FIG. 1) to be feed directly into a baseband polyphase filter, or alternatively feed into a programmable signal scaler 110 without a Q-factor trim block $110b_2$ that is shown in FIG. 7 between the on-chip inductor 705b and reconfigurable mixer array 725, where the programmable signal scaler 110 can be configured to set the DC bias as well as its signal attenuation.

Disclosed programmable multi-band receivers provides a wide reconfigurability of the center frequency of the receiver with a minimum cost due to reduced substrate (e.g., Silicon) area. Disclosed programmable multi-band receivers can be electronically reconfigured for required latency and filtering. Disclosed programmable multi-band receivers also accommodate a selection to be made for large amplitude power supply blocker signal if needed for a given application.

Advantages of disclosed programmable multi-band receivers include wide reconfigurability of center frequency for multi-band low latency operation. Both the latency, as well as image rejection can be configured by software (e.g., implemented by a digital controller). The programmable multi-band receiver can be fully integrated; only the coils being external to the chip, but the coils can be integrated using on-package inductor/thick copper using post processing. The programmable multi-band receiver is robust with respect to the blocker level. Generally, all positive supply voltages for ESD can be used as there can be provided a common mode bias internally from the chip-side, and the fixed capacitance part 110a can also be programmable to attenuate a large signal when necessary, thereby leading to a safe ESD operation scenario as one does want ESD to trigger during normal programmable multi-band receiver operation as this will cause current to flow into the substrate, such as a large input swing to the negative side would do. As disclosed programmable multi-band receivers can use a series capacitor (see C, in FIG. 2A) which provides a DC block, so that the common mode voltage can be set internally from the chip and this can choose the voltage rating of the ESD protection circuit to be used or the device to achieve it based on maximum operating input conditions or the process technology node.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure. For example, disclosed receivers can be used for communications applications besides receivers for wireless power transfer.

The invention claimed is:

1. A programmable multi-band receiver, comprising;
   a programmable signal scaler adapted to be coupled to a signal coupler that provides a received signal including a fixed capacitance part comprising a series set of switchable capacitor arrays positioned before Electrostatic Discharge (ESD) protecting circuitry coupled to a variable capacitance part after said ESD protecting circuitry, said variable capacitance part comprising a tunable capacitor array comprising a parallel set of paths each including a capacitor and at least one switch for setting a center frequency for band selection;
   wherein outputs of said variable capacitance part are coupled to inputs of a reconfigurable mixer array that is coupled to receive phase signals from a local oscillator (LO) circuit comprising a plurality of mixer switch elements for providing image rejection, and
   a baseband polyphase filter, wherein outputs of said reconfigurable mixer array are coupled to inputs of said baseband polyphase filter.

2. The programmable multi-band receiver of claim 1, wherein said fixed capacitance part comprises a resistor bank with switches for setting an ESD bias voltage at its output.

3. The programmable multi-band receiver of claim 1, further comprising a digital controller coupled to said tunable capacitor array and to said reconfigurable mixer array for tuning said tunable capacitor array to provide a selected one of said center frequency for said receiver and programming switches in said reconfigurable mixer array to adjust said image rejection.

4. The programmable multi-band receiver of claim 1, wherein said baseband polyphase filter comprises a passive polyphase filter portion in parallel to an active polyphase filter portion including a cascade of active stages.

5. The programmable multi-band receiver of claim 1, further comprising a Q-factor trim block comprising a set of resistors in series with at least one trim switch for Q-factor trimming using said trim switches for controlling a quality (Q) factor of an LC circuit that also includes a coil.

6. The programmable multi-band receiver of claim 1, wherein said plurality of mixer switch elements include:
an Nth quadrature down-conversion stage coupled to receive said phase signals comprising quadrature differential RF signals at inputs $RF_{N\text{-}0}$, $RF_{N\text{-}80}$, $RF_{N\text{-}90}$, $RF_{N\text{-}270}$, and provides differential quadrature signals $IF_{N\text{-}0}$, $IF_{N\text{-}180}$, $IF_{N\text{-}90}$, $IF_{N\text{-}270}$ at outputs;
wherein:
said $IF_{N\text{-}0}$ equals said $RF_{(N+1),0}$,
said $IF_{N\text{-}180}$ equals said $RF_{(N+1),180}$
said $IF_{N\text{-}90}$ equals said $RF_{(N+1),90}$, and
said $IF_{N\text{-}270}$ equals said $RF_{(N+1),270}$.

7. The programmable multi-band receiver of claim 6, wherein output currents of said mixer switch elements are combined in a first combination to remove a lower sideband image,
wherein $IF_{N\text{-}\Delta}$ equals said $IF_{N\text{-}0}$– said $IF_{N\text{-}270}$, and wherein said Δ is a latency of said reconfigurable mixer array, and $IF_{N,90\text{-}\Delta}$ equals said $IF_{N\text{-}180}$+ said $IF_{N\text{-}270}$,
wherein output currents of said mixer switch elements are combined in a first combination to remove an upper sideband image, wherein:
$IF_{N\text{-}\Delta}$ equals said $IF_{N\text{-}0}$+ said $IF_{N\text{-}270}$, and
$IF_{N,90\text{-}\Delta}$ equals said $IF_{N\text{-}180}$– said $IF_{N\text{-}270}$.

8. The programmable multi-band receiver of claim 3, wherein a latency and said image rejection is configurable by bits from said digital controller.

9. The programmable multi-band receiver of claim 1, further comprising:
a substrate having a semiconductor surface that said programmable multi-band receiver is formed on;
wherein said programmable multi-band receiver is integrated on said substrate as part of an integrated circuit (IC) comprising a contactless interface transceiver, said contactless interface transceiver comprising:
a Primary Data Transceiver including a Transmitter and said Receiver each adapted to be coupled to an Inductor-Capacitor (LC) tank that provides said signal coupler, and wherein said L for at least said programmable multi-band receiver comprises data coils and power coils, wherein said data coils are in an in-plane direction enclosed inside said power coils.

10. The programmable multi-band receiver of claim 9, further comprising an inductive signal attenuator including said data coils residing outside said substrate that magnetically couples to an on-chip inductor.

11. A method of multi-band receiving, comprising:
a programmable multi-band receiver receiving a first signal at a programmable signal scaler from a signal coupler that provides a fixed capacitance part comprising a series set of switchable capacitor arrays positioned before Electrostatic Discharge (ESD) protecting circuitry coupled to a variable capacitance part after said ESD protecting circuitry, said variable capacitance part comprising:
a tunable capacitor array comprising a parallel set of paths each including a capacitor and at least one switch for setting a center frequency for band selection;
wherein outputs of said variable capacitance part are coupled to inputs of a reconfigurable mixer array coupled to receive phase signals from a local oscillator (LO) circuit comprising a plurality of mixer switch elements for providing image rejection, and a baseband polyphase filter, wherein outputs of said reconfigurable mixer array are coupled to inputs of said baseband polyphase filter, said baseband polyphase filter providing an output for said programmable multi-band receiver,
electronically setting at least said center frequency, by selecting respective ones of said switches in said tunable capacitor array.

12. The method of claim 11, wherein said fixed capacitance part comprises a resistor bank with switches, further comprising setting an ESD bias voltage at an output of said fixed capacitance part using said switches of said fixed capacitance part.

13. The method of claim 11, wherein said programmable multi-band receiver further comprises a digital controller coupled to said tunable capacitor array and to said reconfigurable mixer array,
further comprising said digital controller selecting respective ones of said switches in said tunable capacitor array, and programming said reconfigurable mixer array using switches in said plurality of mixer switch elements to adjust said image rejection.

14. The method of claim 11, wherein said baseband polyphase filter comprises a passive polyphase filter portion in parallel to an active polyphase filter portion including a cascade of active stages.

15. The method of claim 11, wherein said programmable multi-band receiver further comprises a Q-factor trim block comprising a parallel set of resistors in series with at least one trim switch, further comprising Q-factor trimming using said trim switches for controlling a quality (Q) factor of an LC circuit that also includes a coil.

16. The method of claim 11, wherein said plurality of mixer switch elements include an Nth quadrature down-conversion stage coupled to receive said phase signals comprising quadrature differential RF signals at inputs $RF_{N\text{-}0}$, $RF_{N\text{-}180}$, $RF_{N\text{-}90}$, $RF_{N\text{-}270}$, and provides differential quadrature signals $IF_{N\text{-}0}$, $IF_{N\text{-}180}$, $IF_{N\text{-}90}$, $IF_{N\text{-}270}$ at outputs;
wherein:
said $IF_{N\text{-}0}$ equals said $RF_{(N+1),0}$,
said $IF_{N\text{-}180}$ equals said $RF_{(N+1),180}$
said $IF_{N\text{-}90}$ equals said $RF_{(N+1),90}$, and
said $IF_{N\text{-}270}$ equals said $RF_{(N+1),270}$.

17. The method of claim 16, wherein output currents of said mixer switch elements are combined in a first combination to remove a lower sideband image,
wherein $IF_{N\text{-}\Delta}$ equals said $IF_{N\text{-}0}$– said $IF_{N\text{-}270}$, and wherein said Δ is a latency of said reconfigurable mixer array, and $IF_{N,90\text{-}\Delta}$ equals said $IF_{N\text{-}180}$+ said $IF_{N\text{-}270}$,
wherein output currents of said mixer switch elements are combined in a first combination to remove an upper sideband image, wherein:
$IF_{N\text{-}\Delta}$ equals said $IF_{N\text{-}0}$+ said $IF_{N\text{-}270}$, and
$IF_{N,90\text{-}\Delta}$ said equals said $IF_{N\text{-}180}$– said $N_{N\text{-}270}$.

18. The method of claim 13, wherein said selecting respective ones of said switches in said tunable capacitor array for setting said center frequency and said programming said reconfigurable mixer array using switches in said plurality of mixer switch elements to adjust said image rejection are both performed dynamically while said programmable multi-band receiver is receiving said first signal.

19. The method of claim 13, wherein said selecting respective ones of said switches in said tunable capacitor array for setting said center frequency and said programming said reconfigurable mixer array using switches in said plurality of mixer switch elements to adjust said image rejection are both performed at power up of said programmable multi-band receiver or while said programmable multi-band receiver is not receiving said first signal.

20. The method of claim 11, further comprising attenuating said first signal using inductive signal attenuation.

* * * * *